United States Patent [19]
Boles et al.

[11] Patent Number: 6,150,197
[45] Date of Patent: Nov. 21, 2000

[54] METHOD OF FABRICATING HETEROLITHIC MICROWAVE INTEGRATED CIRCUITS

[75] Inventors: Timothy Edward Boles, Tyngsboro; Joel Lee Goodrich, Westford, both of Mass.

[73] Assignee: The Whitaker Corp., Wilmington, Del.

[21] Appl. No.: 08/845,727

[22] Filed: Apr. 25, 1997

[51] Int. Cl.$^7$ ............................................. H01L 21/77
[52] U.S. Cl. ........................... 438/128; 438/DIG. 928; 438/DIG. 967; 438/DIG. 977
[58] Field of Search .......................... 438/39, 40, 455, 438/694, 697, 698, 128, DIG. 928, DIG. 967, DIG. 977; 330/286, 307; 156/644, 654, 663, 901

[56] References Cited

U.S. PATENT DOCUMENTS

| | | |
|---|---|---|
| 4,737,236 | 4/1988 | Perko et al. . |
| 4,851,078 | 7/1989 | Short et al. . |
| 5,102,822 | 4/1992 | Calligaro ................................... 437/67 |
| 5,268,310 | 12/1993 | Goodrich et al. ......................... 437/15 |
| 5,569,620 | 10/1996 | Linn et al. . |
| 5,652,173 | 7/1997 | Kim . |
| 5,696,466 | 12/1997 | Li . |
| 5,750,433 | 5/1998 | Jo . |
| 5,849,627 | 12/1998 | Linn et al. . |
| 5,877,037 | 3/1999 | O'Keefe et al. . |

FOREIGN PATENT DOCUMENTS

| | | | |
|---|---|---|---|
| 0 342 094 A1 | 4/1989 | France ........................................ | 21/76 |
| 0 592 002 A2 | 10/1993 | Japan ........................................ | 23/482 |
| 0 534 271 A2 | 9/1992 | United Kingdom ..................... | 21/331 |
| WO 97/35340 | 9/1997 | WIPO ........................... H01L | 21/762 |

OTHER PUBLICATIONS

Charles A. Haroer and Martin B. Miller, Electronic Packaging, Microelectronics, and Interconnection Dictionary, p. 208, 1993.

Percy Chinoy et al., "Manufacture of Low–Loss Microwave Circuits Using HMIC Technology", IEEE MTT–S Digest, p. 1137–1140, 1994.

U.S. Patent Application No. 08/640,290, Docket No. 16422, Entitled: "Process For Reducing Bond Resistance In Semiconductor Devices And Circuits". Filed Jul. 22, 1996.

"Glass Microwave IC Packaging Technology", Publication Date, Oct. 5, 1994, Presented by Richard Perko, M/A–COM Inc., Electro International 1994, Hynes Convention Center, Boston, MA, May 10–12, 1994, pp. 857–862.

*Primary Examiner*—Charles Bowers
*Assistant Examiner*—Evan Pert

[57] ABSTRACT

A process for fabricating heterolithic microwave integrated circuits. According to one exemplary embodiment, a glass substrate is fused to a silicon wafer, and the silicon wafer is etched to effect silicon pedestals. A glass layer is fused onto and about the silicon mesas and effectively polished to expose the tops of the silicon mesas. The backside glass layer is then polished to render a final thickness of the dielectric layer between the top surface and ground plane. In another exemplary embodiment, a layer of silicon may be selectively etched to form mesas that function as either pedestals or vias. A layer of glass may be fused to the silicon prior to etching. A layer of glass is fused to the silicon substrate and pedestals and planarized through standard polishing techniques. The wafer may be "flipped over" and polished in order to remove a substantial portion of the silicon or glass, depending on which is used. Thereafter, the integrated circuit is fabricated through standard techniques.

27 Claims, 4 Drawing Sheets

METHOD OF FABRICATING HETEROLITHIC MICROWAVE INTEGRATED CIRCUITS

FIELD OF THE INVENTION

The present invention relates to a process for manufacturing high yield heterolithic microwave integrated circuits (HMIC).

BACKGROUND OF THE INVENTION

Heterolithic microwave integrated circuits (HMIC) are one viable approach to low cost mass produced integrated circuits for rf and microwave applications. To this end, the use of the heterolithic structure in which silicon pedestals are selectively disposed about various materials to include glass for fabrication of integrated circuits, has been employed in a variety of applications. Examples of such integrated circuits and the processes for the manufacture thereof are as found in U.S. Pat. Nos. 5,268,310 and 5,343,070 to Goodrich et al., the disclosures of which are specifically incorporated herein by reference. In such an integrated circuit, what is generally required is the ability to make series connections and elements on the top surface isolated from connections on the bottom surface. Additionally, the ability to make required connections from the top surface of the integrated circuit to the bottom surface is desired.

The interconnections from devices on the top surface to the bottom surface on which is disposed the ground plane of the HMIC are relatively straight forward. These interconnections are generally effected by the use of heavily doped silicon pedestals for conduction of current from the top surface to the bottom surface of the IC. Conversely, in order to effect the series connections and elements on the top surface, the silicon pedestals are connected to elements on the top surface of the HMIC, but are isolated from the ground plane. In order to achieve this isolation, an insulating material such as polyimide is disposed between the pedestal and the ground plane to act as an isolator between the top surface and the bottom surface so as to electrically isolate selected portions of the top surface from the bottom surface.

FIG. 1 shows the final result of the prior technique of manufacture for the HMIC. The general structure having the silicon pedestals 101 having the glass material 102 for selective isolation of the various pedestals from one another is a relatively standard structure as is described in the above referenced patent application and patent. In the process of fabricating the structure shown in FIG. 1, those pedestals 103 which are effectively isolated from the lower surface of the substrate, a metal layer 104, are effected as follows. After the formation of a pedestal such as that shown at 101, the undersurface or backsurface of the wafer is selectively etched in order to backfill the etched portion with an electrically nonconductive material such as polyimide 105. Thereafter, the metal layer 104 is deposited through standard technique and the selected isolation of elements 106 from the metal ground plane 104 in order to effect the desired interconnections on the top surface of the substrate is achieved.

One of the critical factors in the use of the heterolithic structure as is shown in FIG. 1 is the overall thickness of the integrated circuit. To this end, the thickness of the glass used as the dielectric dictates the inductance of various elements on the top side of the substrate. The various elements, such as inductors, that are used in the rf circuit on the top surface of the substrate must be properly impedance matched and in fact may be part of the matching circuit. Accordingly, the elements such as inductors, which form resonators in a matching circuit, must have a resonant condition at a prescribed frequency in order to properly effect the impedance matching of the various elements. Because the thickness of the substrate dictates the inductance of various resonant elements, it is clear that the precision of the resonant circuit elements on the top surface of the substrate is dependent upon the precision of the thickness of the substrate. Accordingly, in the processing of heterolithic microwave integrated circuits, the thickness of the dielectric between the top surface circuit element and signal lines and the ground plane of the HMIC must be maintained to a very precise value.

In order to properly effect the desired thickness of the dielectric and the isolation of certain elements as shown in FIG. 1, the wafer is processed with the precision of the thickness in mind. To this end, the process of bonding the glass to the silicon through standard fusion techniques as is described in the above referenced patents is effected. Thereafter, the silicon pedestals are etched through the back of the wafer after the final thickness of 5 to 8 mils is achieved. Accordingly, cavities are formed and these cavities must be filled with an electrically nonconductive material in order to properly isolate the selected silicon pedestals from the metal ground plane which is deposited as shown at 104. It is clear that the desired thickness is maintained and thereby the performance characteristics of the various elements and the required impedance matching is carried out with great precision.

Unfortunately, the process fabricating the HMIC with the vias as well as pedestals isolated from the ground plane as is shown in FIG. 1 has proved to be very problematic. The problems encountered in processing the wafer generally are direct results of attempts to process wafers which have been etched to be too thin. Often this is manifest in breakage, as well as incomplete electrical isolation of the series elements. The latter is difficult to inspect after fabrication. The resulting yields are unfortunately very unpredictable ranging from 0% to a maximum of on the order of 68%. Even if it were possible to consistently achieve the yields of 68%, this is an unacceptable value if one is to maintain low cost as is required in the rf and microwave wireless markets.

Accordingly, what is needed is a new process for fabricating heterolithic microwave integrated circuits which affords the precision of thickness of the dielectric between the top surface and the ground plane, thereby enabling good performance characteristics of the resulting circuit while increasing the manufacture yields to an acceptable and consistent level. To this end, a technique is required for fabricating HMIC circuits having selectively isolated pedestals for series elements and circuits as well as vias for interconnecting the top surface of the HMIC to the lower surface ground plane. By increasing the manufacturing yields to an acceptable level, the overall cost of the end product will be reduced without sacrificing the performance of the circuit.

SUMMARY OF THE INVENTION

The present invention relates to a process for fabricating heterolithic microwave integrated circuits in which the thickness of the wafer is never reduced to a point that the disadvantages of the prior art with regard to processing thin wafers is encountered.

In the process for fabricating an HMIC having isolated pedestals for series connections alone, a glass substrate having the thickness on the order of approximately 20 mils is fused via standard HMIC techniques to a silicon wafer having a thickness on the order of approximately 15 mils. Thereafter, using techniques well known in the art, the silicon wafer, preferably a monocrystalline material, is selectively anisotropically etched to effect silicon pedestals. During this process, the thickness of the glass substrate is maintained on the order of 20 mils. Thereafter a glass layer is fused in and about the silicon pedestals and effectively polished to expose the tops of the silicon pedestals. UHCVD epitaxial and metallization fabrication using standard techniques is then carried out. The backside glass layer is then polished to render a final thickness of the dielectric layer between the top surface and ground plane on the order of approximately 5 to 8 mils. The end result is a structure that has the silicon pedestals of the HMIC structure while maintaining the approximately 5 to 8 mil thickness of the glass layer between the top surface and the ground plane required for the proper performance of the rf or microwave circuit disposed primarily on the top surface of the substrate. The glass layer functions as the dielectric material between pedestals, elements and devices on the top surface of the integrated circuit substrate and the lower surface ground plane located on the underside or backside of the glass substrate.

In the second type process of the present invention, two pedestal types are fabricated. The first type is a silicon pedestal which enables electrical connection between the top surface of the HMIC and the lower surface ground plane. This first type of pedestal is known in the art as a via. The second type of pedestal is also a silicon pedestal inhibits electrical connection from the top surface to the bottom surface of the HMIC. This particular pedestal type enables series elements on the top surface as described above and hereinafter to be electrically interconnected, while effectively isolating these elements from the lower ground plane. In this process, a layer of silicon having a thickness on the order of 35 mils is selectively etched to effect the desired pedestals of the two types described above. Alternatively, a layer of glass of a thickness of about 20 mils is fused to a layer of silicon of a thickness of about 15 mils. The silicon is anisotropically etched to reveal the pedestals. Thereafter, a layer of glass is fused to the silicon substrate and pedestals, and thereafter planarized through standard polishing techniques. The thickness of this glass layer after replanarization is on the order of 15 mils; the vias are on the order of 9–10 mils and the pedestals for series elements are on the order of 3–4 mils in height. After the replanarization process, the wafer is "flipped over" and polished in order to remove a substantial portion of the silicon or glass depending on which is used. This exposes the tops of the pedestals. This process, which removes approximately a 20 mil thickness of silicon, effectively creates a front side quality to the backside of the wafer through the polishing process. Thereafter, the integrated circuit is fabricated through standard techniques.

OBJECTS, FEATURES, AND ADVANTAGES

It is an object of the present invention to have a process for fabricating heterolithic microwave integrated circuits in large quantity and high consistent yield.

It is a further object of the present invention to have a process for fabricating HMIC devices with selective isolation of series components and selective electrical connections through vias.

It is a feature of the present invention to process a relatively thick glass substrate having the required HMIC structure disposed thereon, including the required selectively anisotropically etched silicon pedestals.

It is a further feature of the present invention to effect a heterolithic microwave integrated circuit having the required system performance characteristics through a precise dielectric thickness.

It is an advantage of the present invention to have the required system performance of resonant circuit elements achieved through effective and proper electrical isolation.

DETAILED DESCRIPTION OF THE INVENTION

Figure 2:
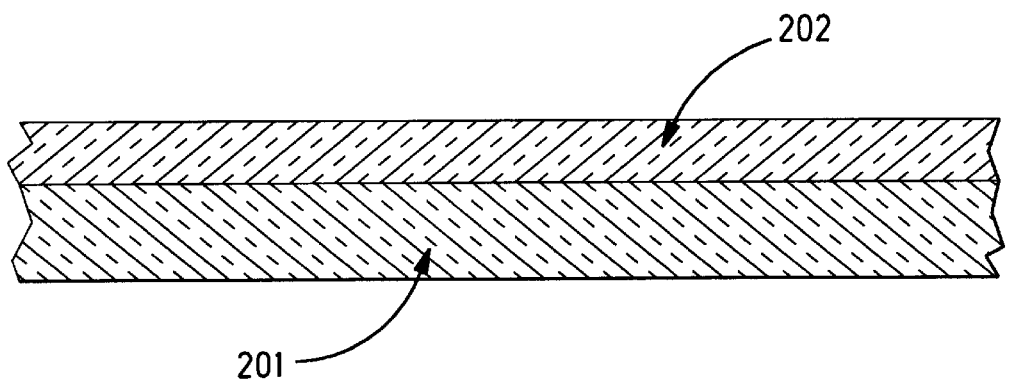
FIGS. 2 to 6 show the processing steps of the embodiment of the present invention having isolated pedestals.

Turning to FIG. 2 the glass substrate layer 201 is shown having been properly fused to a silicon wafer 202 through standard technique. The glass substrate is approximately 20 mils in thickness while the silicon wafer is approximately 15 mils in thickness. The fusion of the two layers is as described herein. The preferred material for the glass are for example Corning 7070, although any dielectric material having a low loss at high frequency and is mechanically expansion matched to silicon will work. The silicon wafer is preferably a monocrystalline material having well-defined crystallographic planes which are exploited during the etching process described herein.

Figure 3:
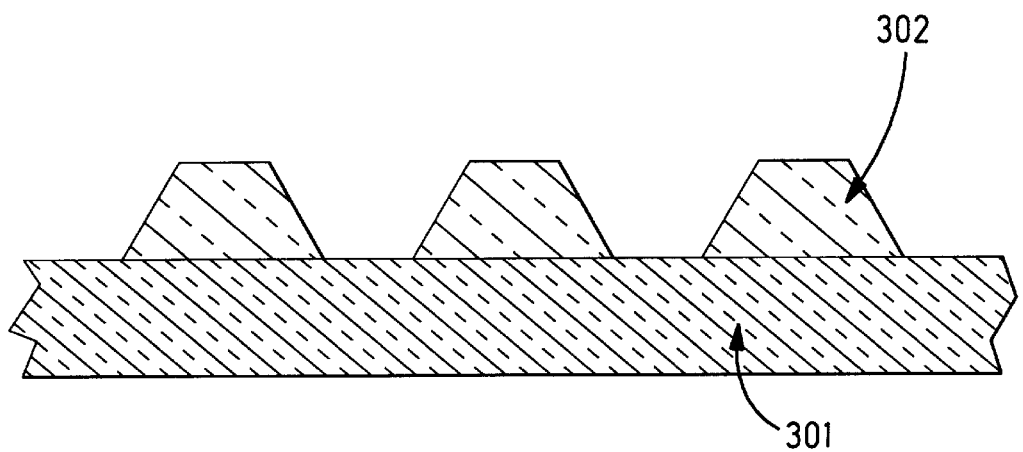
Figure 4:
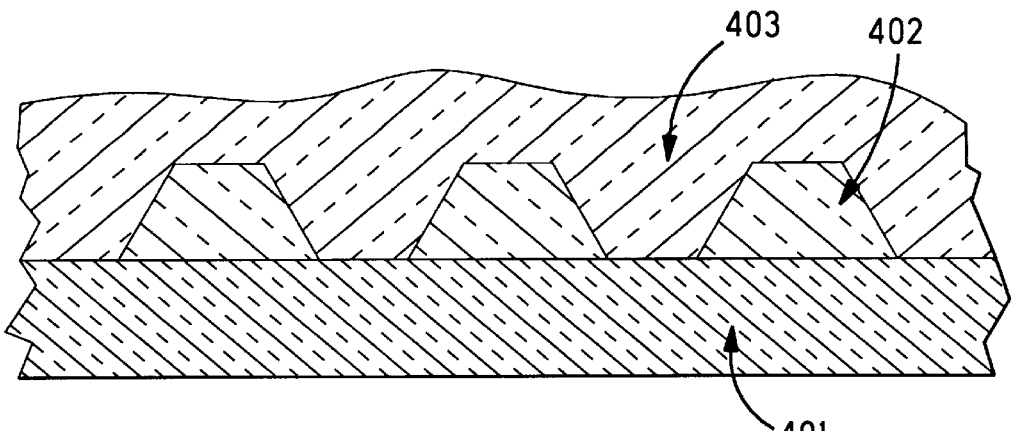

Turning to FIG. 3, the first step in the processing by the present invention is shown where the silicon wafer is anisotropically selectively etched to provide silicon pedestals having a height on the order of 3 to 4 mils. This etching of the silicon pedestals is carried out through a wet etch process, for example, as is described in U.S. Pat. No. 4,210,923 to North et al., or the references to Goodrich, et al., the disclosures of which are specifically incorporated herein by reference. The orientation of the silicon pedestal sidewalls and top surfaces are well defined in preferred crystallithographic planes. The pedestals shown in FIG. 3 are those supporting electronic circuitry on the top surface. These series elements are to be isolated from the metal ground plane on the lower surface of the glass substrate 201. Finally, it is of interest to note that the silicon wafer in thereof lie the silicon pedestals are properly doped $n^+$ with a suitable donor dopant to a doping concentration to achieve a resistivity on the order of 0.002–0.006 ohm/cm. Thereafter, turning to FIG. 4 the silicon pedestals 402 are shown effectively isolated from one another electrically through the fusion of a glass material 403 as described above.

The process of fusing glass to silicon in the present invention is as described presently. The silicon having been selectively etched as described above has further a peripheral rim about the wafer that acts as a seal. This seal becomes important in effecting a pressure differential as described herein. The silicon having the selectively etched regions has disposed thereon a glass substrate preferably Corning 7070. This assembly is thereafter disposed in a tube and placed at a selected temperature between the range 30 of about room temperature and about 500° C. and is placed in a vacuum chamber. This vacuum chamber is thereafter pumped down to $10^{-5}$ Torr. Thereafter, the assembly is heated to on the order of preferably 800° C. The glass material thereafter becomes malleable and the assembly is thereafter removed from the high pressure environment. In removing the assembly from the vacuum chamber a pressure differential is created. The cavities in the silicon is at approximately $10^{-5}$ Torr and by virtue of the seal effected by the ridge about the periphery of the wafer, this pressure is maintained. However, the assembly, in particular the upper surface of the glass is now at atmospheric pressure on the order of $10^3$ Torr. This pressure differential enables the malleable glass to be fused into the cavities which are at a very low pressure. During this process, selected small pockets or voids are observed in the lower corners of the pedestals. These pockets are of little concern, since the polishing subsequent to this processing technique effectively eliminates the pockets. Finally, it is of interest to note that the fusion of the glass layer 201 to the silicon substrate 202 does not require the ridge for sealing purposes and can be effected by heating and pressure differential techniques described above.

Figure 5:
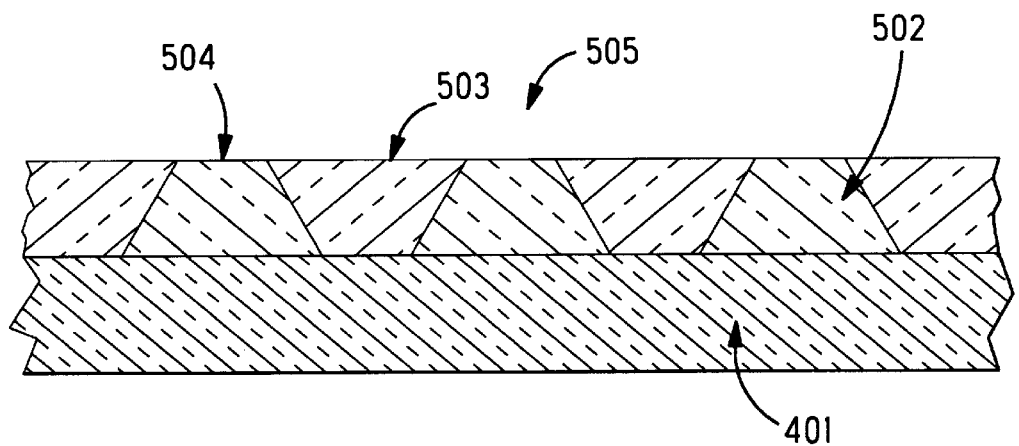

Thereafter in order to properly planarize the top surface of the substrate to a height approximately level with the top surface of the silicon pedestals as shown in FIG. 5, a polishing technique is employed. The polishing technique is a standard technique well known to the artisan of ordinary skill. The polishing height is effected generally to a level so as to expose the pedestals as is shown at 503.

Figure 6:
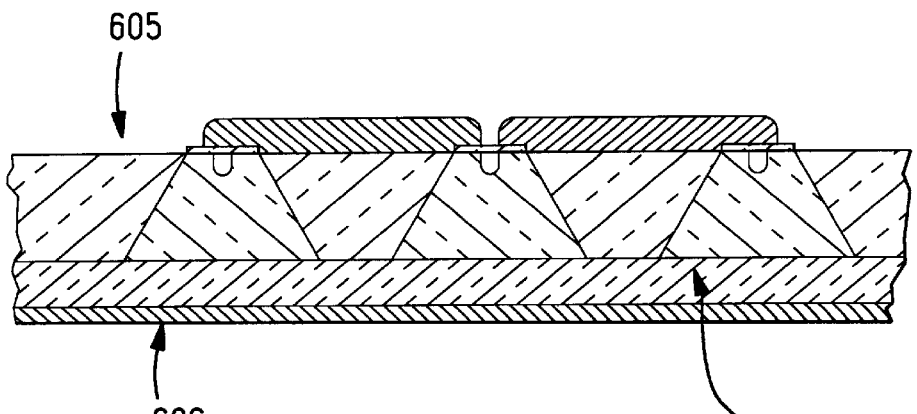

The end result, as shown in FIG. 5, is a substrate of glass on the order of approximately 20 mils having the selectively anisotropically etched silicon pedestals 502 selectively isolated from one another by the glass material 503, while being properly exposed as at 504 for effective placement and interconnection of device circuitry on the top surface 505 of the HMIC. In a step not shown through drawing figures, an epitaxial layer is formed as is required on the top surfaces 504 of the silicon pedestals. This processing step is effected for all silicon pedestals as is required in order to properly effect the electrical connections for various devices. To this end the silicon pedestals 302, 402, 502 are as stated highly doped $n^+$, and in order to effect devices such as a schottky diode where a metal/semiconductor barrier potentials is required, an epitaxial layer must be grown on the silicon pedestals having a doping concentration which is lower than that of the pedestals in order to avoid the shorting effects that can result through the highly conductive path of the silicon pedestals. Finally, as is shown in FIG. 6, the backside surface of glass 601 is polished through the same technique that is used to polish the top surface of the glass described above, in order to effect 15 the proper thickness of the glass layer between the top surface and the ground plane. The thickness of the glass dielectric between the top surface 605 of the HMIC and the ground plane 606 of 5 to 8 mils and has the attendant benefit of performance at the desired center frequencies for resonant elements on the top surface of the substrate.

Figure 7A:
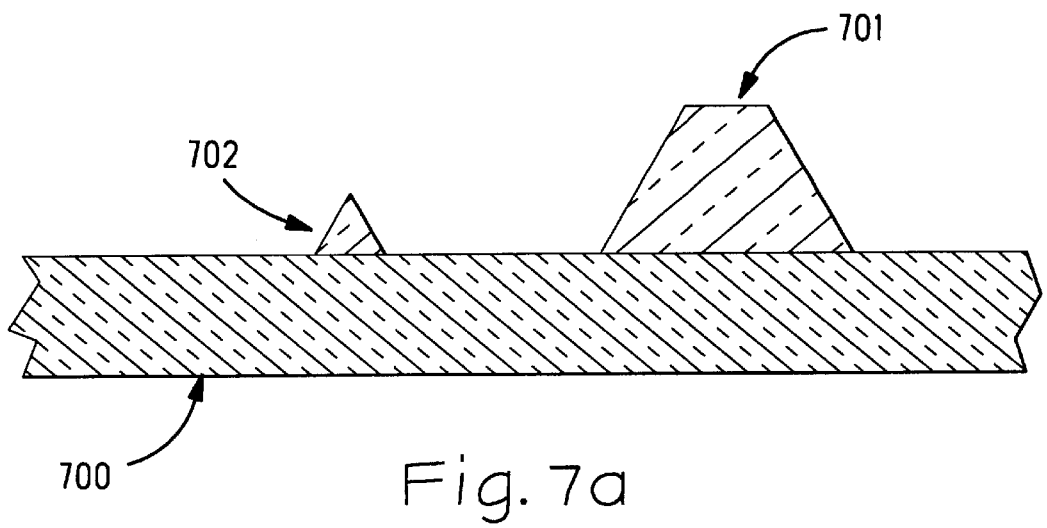
FIGS. 7a, 7b, and 8 to 11 show the processing steps of the embodiment having both vias and isolated pedestals.
Figure 7B:
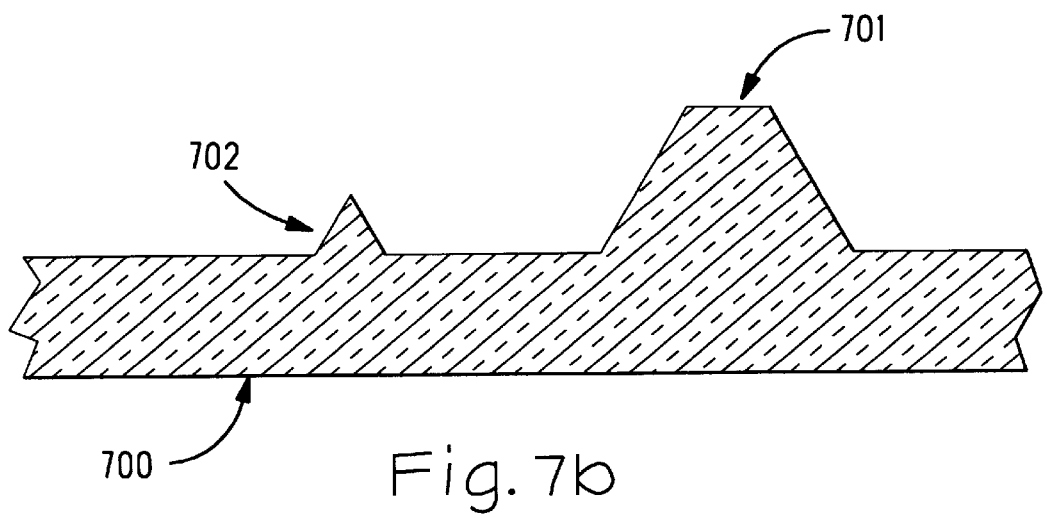

The second process for manufacture of the present invention is now described. Turning to FIG. 7a, a wafer of silicon of a thickness on the order of 35 mils has both selectively located anisotropically etched pedestals 702 and vias 701. After further processing described herein, the pedestals 702 will be electrically isolated from the ground plane and the vias 701 will serve as an electrical path between the top surface and ground plane. Alternatively, a silicon wafer of approximately 15 mils thickness is bonded to a glass substrate 700 through standard technique as described previously. The differing heights and profiles of the pedestals of silicon 701, 702 as shown in FIG. 7 are effected through wet etching techniques as described in the reference North et al.

To this end, in order to fabricate the pedestals 701 which function as vias in the final product, a differing mask pattern than that of the pedestals 702 which serve to isolate series elements on the top surface of the HMIC is used. Additionally, the profiles and heights of the two different pedestals 701 and 702 are achieved through the different masks and anisotropic etching processes. These etching processes are well known in the art. Finally, to effect different profiles and heights the silicon pedestals are properly doped $n^+$ as described above.

Figure 8:
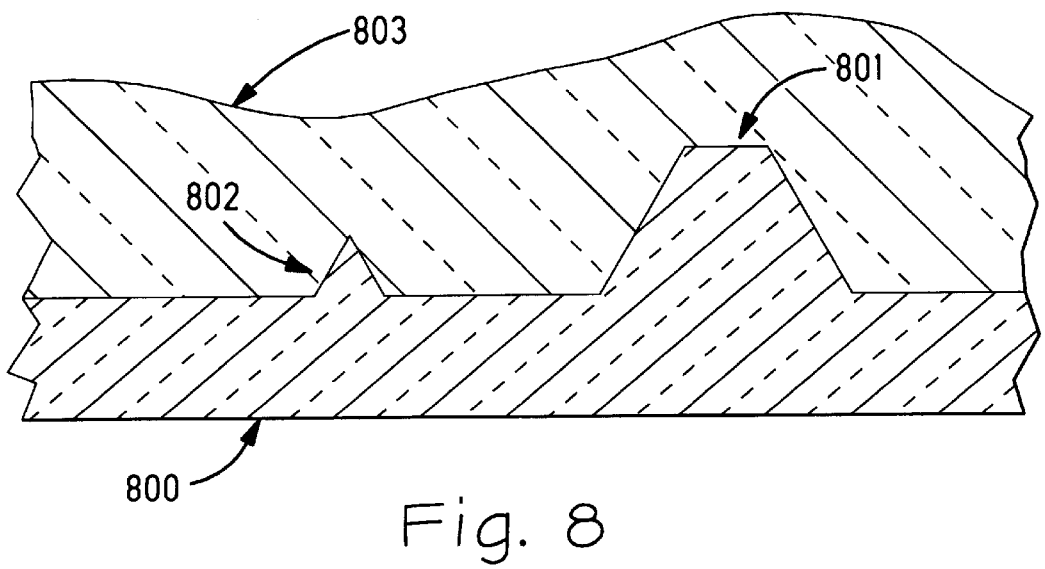
Figure 9:
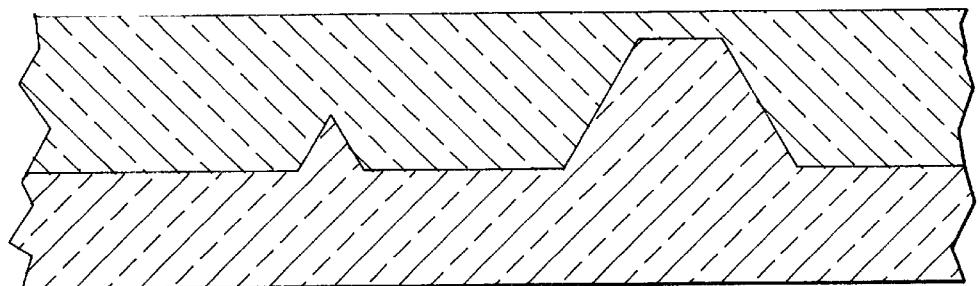
Figure 10:
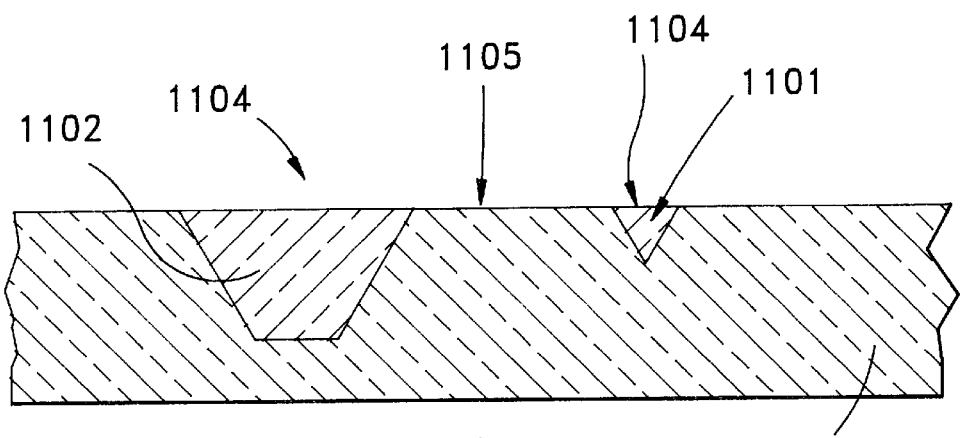
Figure 11:
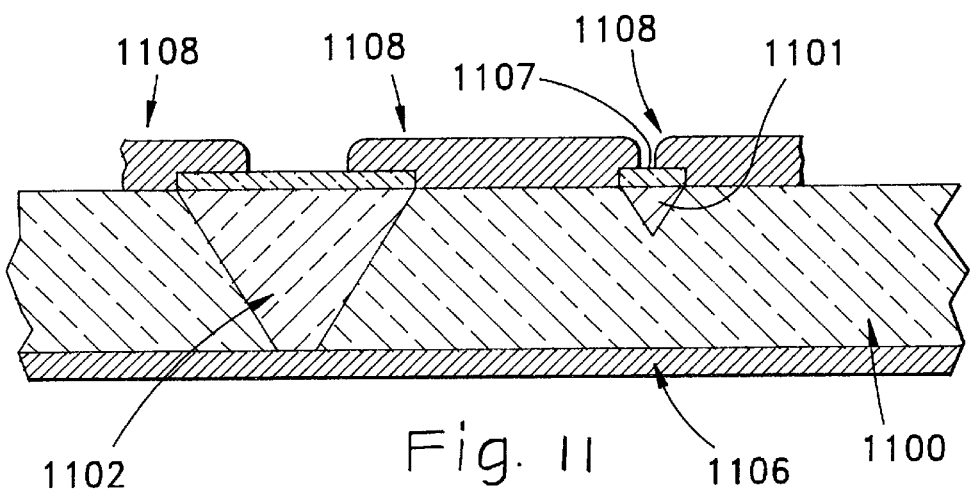

Turning to FIG. 8, glass material 803 preferably the same materials as is described above is fused in a thickness on the order of 20 mils on top of the base substrate of silicon 800. This layer of glass effectively isolates the pedestals 802 and 801 and will serve not only in this function but as the dielectric material for the circuit. Turning to FIG. 9, we see the final result after replanarization through standard polishing techniques. The glass layer is polished to a thickness on the order of 15 mils, although other thicknesses are possible, and it is preferred to make this layer as thick as possible. Thereafter, the wafer is "flipped over" and the approximately 20 mil thick layer of silicon 900 is removed through standard polishing techniques. This polishing effects a front side surface quality to the backside surface of the wafer. Finally, as is seen in FIG. 10 the wafer is a "flipped over" HMIC having selectively disposed glass material in-between the silicon pedestals as desired. The result, as is shown in FIG. 10, is a layer of glass on the order of approximately 20 mils in thickness having selectively etched silicon pedestals 1101 and vias 1102 isolated electrically from one another by the glass material 1103. The final step in the processing of the substrate is as shown in FIGS. 10 and 11 in which the glass layer 1103 is polished to a final thickness on the order of 5 to 8 mils exposing the shunt via 1102 at the lower surface of the substrate. The via 1102 is electrically connected to the ground plane 1106 fabricated by standard metallization techniques. The series elements are 1108 disposed on the top surface 1105 and are connected to pedestals 1101 having been isolated by the glass material 1103. The polishing process exposes the pedestals and vias as at 1104 enabling effective placement and interconnection of device circuitry on the top surface 1105 of the HMIC.

Thereafter, an epitaxial layer 1107 is formed as is required on the top surface of the silicon pedestals 1104 to effect the barriers as described above. The fabrication of the integrated circuits on the top surface and the various elements, such as devices both active and passive as well as signal lines by standard metallization technique.

As can be appreciated, the resulting structure has functional characteristics of performance that are highly desired while the yield of manufacture is maintained at an acceptable and consistent level. The end result is a low cost heterolithic microwave integrated circuit with the performance characteristics desired. The major reason for the ability to fabricate the HMIC in high yield, therefore at low cost is because the thickness of the glass substrate is always great enough to avoid the attendant problems of processing a thin wafer. The backside processing as described by "flipping" the chip over during the processing enables standard fabrication techniques to be performed on a wafer of adequate thickness to avoid breakage. Furthermore, the layers are of sufficient thickness to act as "handles" during processing. Furthermore, the selective etching of the silicon pedestals enables strict control of the height and profiles of the pedestals for desired function. To this end, both shunt vias as well as electrical isolation of series elements on the top surface from the lower ground plane are enabled through the above described process.

Figure 1:
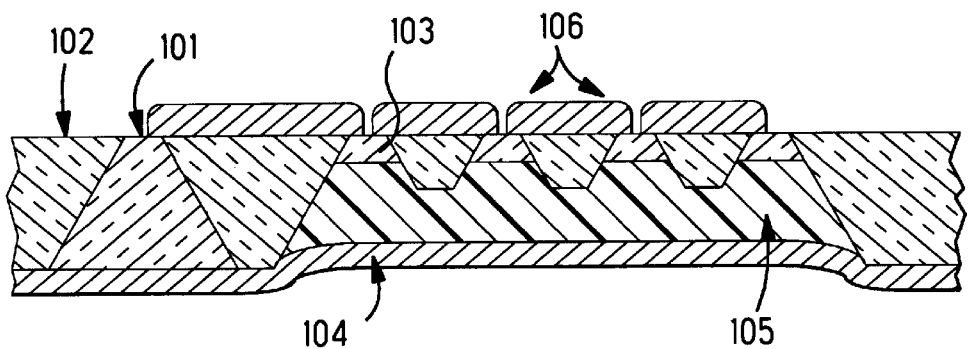
FIG. 1 is a cross-sectional view of the prior art showing the polyimide isolation layers deposited to effect the isolation of selected silicon pedestals.

Finally, one of the major drawbacks to silicon vias used in high frequency applications is access losses which can be effected from the top surface circuitry by way of the vias to the lower ground plane. A loss occurs when metal signal lines on the top surface of an HMIC effect losses through the pedestal as follows. The transmission lines on the top surface are deposited on a dielectric, for example glass. The side surfaces of the vias pedestals are made very conductive through superdoping $n^{++}$. This $n^{++}$ layer on the side surfaces of the pedestal is effectively a ground plane in-between the metal layer and the dielectric. It also serves to complete a capacitor. Unfortunately, the material on the side surfaces of the pedestal, the $n^{++}$ layer, is lossy at high frequencies. Accordingly, one technique to reduce the loss is to deposit a layer of cobalt disilicide on the side surfaces of the pedestal. This layer of cobalt disilicide is less lossy than the $n^{++}$ layer. In this way while there is still the coupling to the effective ground plane on the side surfaces of the pedestal via, there is nevertheless a reduction in the loss associated with this coupling. The resulting product of the second process reduces drastically the effective coupling as follows. First of all the geometry of the via is inverted from that which is shown in the conventional design in FIG. 1. Thereby, the effective distance between the metal layer on the top surface and the side surface of the pedestal which forms the effective ground plane is great enough so that electromagnetic coupling is drastically reduced. Furthermore, this increase in the distance reduces capacitive coupling greatly. As is well known in the art, capacitive coupling at high frequency transmission is an undesired parasitic effect. Furthermore, a layer of cobalt disilicide is also preferably deposited on the side surfaces of the pedestal in order to effectively reduce the losses by the selected choice of material in addition to the increased distance that the structure of the present invention affords.

The invention having been described in detail, it is clear that there are modifications and variations that are readily conceived by the artisan of ordinary skill. To the extent that these modifications and variations are within the theme an spirit of the teaching of the present invention, processes for fabricating heterolithic microwave integrated circuits as described above, these modifications and variations are deemed within the scope of the invention. To this end the process for fabricating the HMIC is one that avoids processing a relatively thin wafer, and enables fabrication of the desired HMIC and its attendant performance benefits in high consistent yield through the processing of a relatively thick layer. It is clear that other processing steps could be taken, but to the extent that such processing steps are mere variations in modifications within the purview of the skilled artisan they are deemed within the scope of the present invention.

What is claimed is:

1. A process for fabricating a heterolithic microwave integrated circuit comprising the steps of:
    fusing a semiconductor wafer to a substrate of dielectric material;
    forming at least one mesa from said wafer;
    fusing a layer of said dielectric material onto and about said at least one mesa; and
    polishing said layer and said substrate to a final thickness.
2. A process as recited in claim 1 further characterized in that:
    at least one mesa is at least one via and at least one pedestal.

3. A process as recited in claim 1 further characterized in that:
    a conductive ground plane is fabricated on an outer surface of said layer of dielectric material.
4. A process as recited in claim 1 wherein selected electrical interconnections are fabricated on a surface of said layer of dielectric material which has been exposed by polishing said substrate.
5. A process as recited in claim 1 wherein said at least one mesa comprises at least one pedestal, and wherein series elements are fabricated on said said at least one pedestal.
6. A process as recited in claim 1 further characterized in that said at least one mesa formed by selective anisotropic etching of said semiconductor wafer.
7. A process as recited in claim 1 further characterized in that:
    said at least one mesa comprises at least one via etched to have a height great enough to effect electrical interconnection from a top surface of said integrated circuit to a bottom surface of said integrated circuit.
8. A process as recited in claim 1 further characterized in that:
    said at least one mesa is at least one pedestal which is etched to have a height small enough so as to prevent electrical interconnection between a top surface of said integrated circuit and a bottom surface of said integrated circuit.
9. A process as recited in claim 1 further characterized in that:
    said at least one mesa is selectively doped to be conductive.
10. A process as recited in claim 1 further characterized in that:
    said at least one is doped to have a resistivity in the range 0.002 to 0.006 ohms/cm.
11. A process as recited in claim 1 further characterized in that:
    said at least one mesa is at least one pedestal which is electrically isolated from a bottom surface of said integrated circuit by said dielectric material.
12. A process as recited in claim 1 further characterized in that:
    said at least one mesa is exposed at a top surface of said integrated circuit through said polishing of said dielectric substrate.
13. A process for fabricating a heterolithic integrated circuit comprising the steps of:
    fusing a semiconductor wafer to a substrate of a dielectric material;
    forming at least one mesa from said wafer;
    fusing a layer of said dielectric material onto and about said at least one mesa;
    polishing said layer and said substrate to a final thickness; and
    fabricating a ground plane on a lower surface of said integrated circuit and selected transmission elements on an upper surface of said integrated circuit.
14. A process for fabricating an integrated circuit as recited in claim 13 wherein said at least one mesa is formed by anisotropic etching.
15. A process as recited in claim 14 wherein said at least one mesa is at least two mesas wherein at least one mesa serves as a via and at least one mesa serves as a pedestal.
16. A process as recited in claim 15 wherein said selected transmission elements are series elements formed on said pedestals.

17. A process as recited in claim 15 where said polishing of said layer and of said substrate exposes said pedestals and said vias on said upper surface and said vias on said lower surface.

18. A process as recited in claim 15 wherein said via is etched to a height which is greater than the height of said pedestal.

19. A process as recited in claim 13 wherein said at least one mesa comprises at least one pedestal.

20. A process as recited in claim 13 wherein said final combined thickness of said layer and said substrate is on the order of 5 to 8 mils.

21. A process as recited in claim 13 wherein said selected transmission elements are transmission lines.

22. A process as recited in claim 13 further comprising depositing an epitaxial layer on said at least one mesa.

23. A process as recited in claim 13 wherein said polishing of said layer and said substrate exposes said at least one mesa on said upper surface.

24. A process as recited in claim 13 wherein said at least one mesa is uniformly doped to have a resistivity in the range of 0.002 to 0.006 ohm/cm.

25. A process as recited in claim 13 wherein said wafer is silicon.

26. A process as recited in claim 13 wherein said wafer is monocrystalline.

27. A process for fabricating a heterolithic integrated circuit comprising the steps of:

forming at least one mesa from a wafer of a semiconductor;

fusing a layer of dielectric material onto and about said at least one mesa;

polishing said wafer and said layer to a final thickness;

fabricating a ground plane on the polished layer which forms a lower surface of said integrated circuit; and forming selected transmission elements on the polished wafer which forms an upper surface of said integrated circuit.

* * * * *